(12) United States Patent
Morimoto

(10) Patent No.: US 6,885,081 B2
(45) Date of Patent: Apr. 26, 2005

(54) SEMICONDUCTOR CAPACITOR DEVICE HAVING REDUCED VOLTAGE DEPENDENCE

(75) Inventor: Hidenori Morimoto, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/656,286

(22) Filed: Sep. 8, 2003

(65) Prior Publication Data

US 2004/0046203 A1 Mar. 11, 2004

Related U.S. Application Data

(63) Continuation-in-part of application No. 09/987,142, filed on Nov. 13, 2001, now abandoned.

(30) Foreign Application Priority Data

Nov. 13, 2000 (JP) .................................... 2000-345060

(51) Int. Cl.$^7$ ............................................. H01L 29/00
(52) U.S. Cl. ...................... 257/532; 257/307; 257/312; 257/535; 257/306; 257/528; 257/313; 361/301.4; 361/303; 361/328
(58) Field of Search ............................... 257/313, 312, 257/307, 535, 306, 528, 532; 361/301.4, 303, 328

(56) References Cited

U.S. PATENT DOCUMENTS

| | | | | |
|---|---|---|---|---|
| 4,700,457 A | * | 10/1987 | Matsukawa | 438/396 |
| 4,878,151 A | * | 10/1989 | Gallichio | 361/329 |
| 5,021,920 A | * | 6/1991 | Smith | 361/311 |
| 5,208,597 A | * | 5/1993 | Early et al. | 341/172 |
| 5,799,379 A | | 9/1998 | Galvagni et al. | |
| 6,066,537 A | * | 5/2000 | Poh | 438/393 |
| 6,069,050 A | | 5/2000 | Hou et al. | |
| 6,190,964 B1 | * | 2/2001 | Winters | 438/254 |
| 6,204,104 B1 | | 3/2001 | Fujii | |
| 6,222,221 B1 | * | 4/2001 | Hou et al. | 257/307 |
| 6,303,957 B1 | | 10/2001 | Ohwa | |
| 6,476,436 B1 | * | 11/2002 | Kuwazawa | 257/306 |

FOREIGN PATENT DOCUMENTS

| | | |
|---|---|---|
| JP | 61-49458 A | 3/1986 |
| JP | 63-150955 A | 6/1988 |
| JP | 3-139876 A | 6/1991 |
| JP | 3-252160 A | 11/1991 |
| JP | 4-171978 A | 6/1992 |
| JP | 5-75021 A | 3/1993 |
| JP | 7-86528 A | 3/1995 |
| JP | 11-163175 A | 6/1999 |
| JP | 2001-189421 A | 7/2001 |
| JP | 2002-151649 A | 5/2002 |
| WO | 98/43298 A1 | 10/1998 |

* cited by examiner

Primary Examiner—Tom Thomas
Assistant Examiner—Eugene Lee
(74) Attorney, Agent, or Firm—Birch, Stewart, Kolasch & Birch, LLP

(57) ABSTRACT

A semiconductor capacitor device has two pairs of first and second MIM capacitors on a semiconductor substrate. The paired first and second MIM capacitors include respective capacitor dielectric films having different compositions. Also, the paired first and second MIM capacitors are connected in inverse parallel fashion, with an upper electrode of the first MIM capacitor being connected with a lower electrode of the second MIM capacitor and with a lower electrode of the first MIM capacitor being connected with an upper electrode of the second MIM capacitor. Furthermore, the two first MIM capacitors are electrically connected in inverse parallel with each other, and the two second MIM capacitors are also electrically connected in inverse parallel with each other. This arrangement facilitates mutual counteraction of the voltage dependences of the two pairs of first and second MIM capacitors so as to make the voltage dependence of the capacitance of the capacitor device small.

9 Claims, 5 Drawing Sheets

SEMICONDUCTOR CAPACITOR DEVICE HAVING REDUCED VOLTAGE DEPENDENCE

This is a continuation-in-part application of application Ser. No. 09/987,142, filed Nov. 13, 2001 now abandoned.

BACKGROUND OF THE INVENTION

This invention relates to a semiconductor capacitor device formed on a semiconductor substrate, in particular to a semiconductor capacitor device that suppresses a change in its capacitance value due to applied voltage.

In a semiconductor capacitor device used for a semiconductor integrated circuit, in particular, for an analog circuit, the capacitance accuracy greatly influences the accuracy of the whole circuit, and thus it is important to suppress a change in capacitance value due to applied voltage.

On the other hand, with miniaturization of semiconductor integrated circuits, an area of a transistor is required to be reduced. Thus, it is also necessary to reduce a capacitor area. For this reason, thinning a capacitor dielectric film has been carried out, but the coefficient of voltage dependence of a capacitance becomes greater in inverse proportion to the square of the film thickness. Therefore, even if the capacitor dielectric film is made thin, there is still an important task to keep the voltage dependence of the capacitance low.

Incidentally, a capacitor having a structure in which an insulating film is sandwiched between a diffusion layer and polysilicon forms a PN-junction capacitance between the diffusion layer and a substrate. The PN-junction capacitance is highly dependent upon voltage and therefore it becomes difficult to obtain a capacitor of which the capacitance value does not depend on applied voltage.

Further, there is a capacitor having a structure in which a dielectric film is sandwiched between upper and lower polysilicon layers, an example of which is disclosed in JP-A-9-36313. In this type of capacitor element, it is required to dope an electrode made of the polysilicon layer at a high concentration in order to reduce the resistance of the electrode and the voltage dependence of the capacitance value.

However, no matter how high the doping concentration is made, a depletion layer is generated in the polysilicon electrode itself. The width of the depletion layer changes due to the voltage across the electrodes, resulting in a change in the capacitance value. Therefore, a capacitor having the above structure is not suitable for a highly accurate analog circuit.

On the other hand, Japanese Patent Publication JP-A-5-129522 discloses an example of a capacitor having a structure in which a dielectric film is sandwiched between upper and lower metal layers, i.e., an MIM (metal-insulator-metal) capacitor. As shown in FIG. 4, an upper electrode 121 and a lower electrode 118 of the capacitor are made of aluminum and a high melting-point metal, respectively. In the figure, the reference numeral 120 indicates a conductive protective layer, the reference numeral 119 an insulating layer for capacitor, the reference numeral 117 an interlayer insulating layer, and the reference numeral 101 a silicon substrate. Since this type of capacitor element does not cause depletion in the metal electrodes 121, 118, a capacitor of which the capacitance does hardly depend on applied voltage can be obtained. Accordingly, it is particularly useful as an analog capacitor.

Further, it is disclosed in Japanese Patent publication JP-A-7-221599 that as shown in FIG. 5, two MOS (metal-oxide-semiconductor) capacitors 222 and 223 are connected in inverse parallel so that the voltage dependences of the capacitances of the MOS capacitors 222 and 223 counteract each other. In a case where a gate electrode 224 of this MOS capacitor is a metal, a capacitor whose capacitance does not depend on applied voltage and whose performance is equal to that of the MIM capacitor can be obtained.

FIG. 6 shows the voltage dependence of the capacitance of an MIM capacitor using a silicon nitride film as a capacitor dielectric film. As is apparent from FIG. 6, the MIM capacitor also has voltage dependence of the capacitance value, although a little. For this reason, in order to realize an analog-use capacitor having higher performance, even the MIM capacitor requires further suppression of the voltage dependence of its capacitance.

SUMMARY OF THE INVENTION

Accordingly, an object of this invention is to provide a semiconductor capacitor device that can suppress the voltage dependence of its capacitance value more than the conventional MIM capacitors.

In order to accomplish the above object, a semiconductor capacitor device according to the present invention includes:

two first MIM capacitors formed on a semiconductor substrate and each having a lower electrode, a first capacitor dielectric film, and an upper electrode, the first MIM capacitors being electrically connected in inverse parallel with each other; and two second MIM capacitors formed on the semiconductor substrate and each having a lower electrode, a second capacitor dielectric film, and an upper electrode, the second MIM capacitors being electrically connected in inverse parallel with each other and associated with respective first MIM capacitors, the first and associated second MIM capacitors are electrically connected in inverse parallel with each other; and the second capacitor dielectric film having a composition different from that of the first capacitor dielectric film.

That two MIM capacitors are "electrically connected in inverse parallel with each other" herein means that a lower electrode and an upper electrode of one MIM capacitor are electrically connected with an upper electrode and a lower electrode of the other MIM capacitor, respectively.

Preferably, the two first MIM capacitors may have the same shape and size, and the two second MIM capacitors may have the same shape and size.

Firstly, according to this invention, the electrodes of a pair of MIM capacitors (namely, the first and second MIM capacitors) fabricated on the semiconductor substrate are connected in inverse parallel with each other (in other words, the first and second MIM capacitors are connected in parallel with each other, with the upper and lower electrodes of the first MIM capacitor being connected to the lower and upper electrodes of the second MIM capacitor, respectively). Thus, the voltage dependence of the capacitance of the capacitor device is reduced.

That is, as to the voltage-dependence of the capacitance, it is known that the capacitance changes in proportion to the square of applied voltage as shown in the following equation:

$$C = C0 \cdot (1 + a \cdot V + b \cdot V^2) \qquad (1)$$

where C represents a capacitance value, C0 represents a capacitance value at 0 [V], V represents a voltage applied, and a and b are coefficients of the first- and second-order terms of the equation representing the voltage dependence of the capacitance value, respectively.

If a pair of MIM capacitors, Cma and Cmb, are connected in inverse parallel with each other, when a voltage of V is applied to Cma, a voltage of −V is applied to Cmb. Therefore, the voltage dependences of the capacitances of the capacitors (Cma and Cmb) are represented by the equations (2) and (3) respectively:

$$Cma = C0 \cdot (1 + a \cdot V + b \cdot V^2) \quad (2)$$

$$Cmb = C0 \cdot (1 - a \cdot V + b \cdot V^2) \quad (3)$$

Further, the capacitance Cm where the capacitors Cma and Cmb are connected in parallel with each other is represented by the formula (4):

$$Cm = Cma + Cmb = 2C0 \cdot (1 + b \cdot V^2) \quad (4)$$

A coefficient Γ of the voltage dependence of the capacitance is now defined by the following equation (5):

$$\Gamma = (C - C0)/V \cdot 10^6 \text{ [ppm]} \quad (5)$$

In the case of the MIM capacitance shown in FIG. 6, a=−20 [ppm/V] and b=4 [ppm/V²]. Thus, if a single MIM capacitor is used, Γ=−16 [ppm] at an applied voltage of 1 [V], but Γ becomes 4 [ppm] if two MIM capacitors are connected in inverse parallel with each other. Accordingly, it is found that the voltage dependence of the capacitance value of the capacitor device is reduced by connecting the two MIM capacitors in inverse parallel with each other.

Further, in one embodiment of the invention, the voltage dependences of the capacitances of the first and second MIM capacitors are expressed by respective quadratics of voltage, and coefficients of second-order terms of the quadratics have opposite signs.

In this embodiment, the signs of the coefficients of the second-order terms of the quadratics are opposite to each other, whereby the voltage dependence of the capacitance value of the capacitor device can be moreover reduced.

That is, supposing that the capacitance value of the first MIM capacitor having the first capacitor is dielectric film is Cm1, and that the capacitance value of the second MIM capacitor having the second capacitor dielectric film different from the first one is Cm2, the voltage dependences of the capacitances of these MIM capacitors are expressed by the following formulas (6) and (7) respectively from the above equation (4).

$$Cm1 = C01 \cdot (1 + b1 \cdot V^2) \quad (6)$$

$$Cm2 = C02 \cdot (1 + b2 \cdot V^2) \quad (7)$$

In these formulas (6) and (7), b1 and b2 are the coefficients of the second-order terms of the quadratics representing the voltage dependences of the capacitances of the first and second MIM capacitors. Further, C01 represents the capacitance value of the first MIM capacitor at 0 V, while C02 represents the capacitance value of the second MIM capacitor at 0 V. From these equations (6) and (7), it can readily be understood that in obtaining a synthesized capacitance (Cm1+Cm2), a sum of values of the second terms of those equations becomes small because the signs of the coefficients, b1 and b2, of the second-order terms are opposite to each other.

In one embodiment, the coefficient of the second-order term of the quadratic representing the voltage dependence of the capacitance of the first MIM capacitor and that of the second MIM capacitor have the same magnitude or absolute value, and their signs are opposite to each other.

In this embodiment, because the coefficients of the second-order terms of the quadratics representing the voltage dependence of the capacitance of each of the first and second MIM capacitors have the same magnitude and the opposite signs, the voltage dependence of the synthesized capacitance can substantially be made zero from the equations (6) and (7).

In one embodiment, the first and second MIM capacitors share a metal film that serves as the upper electrode of the first MIM capacitor and the lower electrode of the second MIM capacitor.

In this embodiment, sharing the metal film as the upper electrode of the first MIM capacitor and the lower electrode of the second MIM capacitor makes it possible to simplify the structure.

Further, in one embodiment, one of the first and second capacitor dielectric films is formed of a silicon oxide film and the other of the first and second capacitor dielectric films is formed of a silicon nitride film.

In this embodiment, supposing, for example, that the first capacitor dielectric film is a silicon oxide film (a film thickness of 35 nm) and that the second capacitor dielectric film is a silicon nitride film (a film thickness of 65 nm), the voltage dependences of the capacitances of the first and second capacitors become as shown in FIGS. 7 and 6, respectively.

At this time, in the above equations (6) and (7), C01=1 [fF/μm²], b1=−30 [ppm/V²], C02=1 [fF/μm²], and b2=4 [ppm/V²]. When the first and second MIM capacitors that are connected in parallel with each other have the area ratio of 2 to 15 such that the capacitances of these two capacitors satisfy the relationship shown in the equation (8) below, a synthesized capacitance Cm3 of these MIM capacitors is represented by the equation (9) below.

$$C01 \cdot b1 + C02 \cdot b2 = 0 \quad (8)$$

$$Cm3 = Cm1 + Cm2 = C01 + C02 \quad (9)$$

That is, the voltage dependence of the inverse-parallel connection capacitance Cm3 can be made zero.

Again, even if the coefficient Γ of voltage dependence of the capacitance is −16 [ppm] for a single MIM capacitor, the inverse-parallel connection of two MIM capacitors having capacitances with different voltage-dependence characteristics in such a manner that the voltage dependences counteract or cancel each other allows the coefficient Γ of voltage dependence of the capacitance of the capacitor device to be 0 [ppm].

Other objects, features and advantages of the present invention will be obvious from the following description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

An embodiment of the semiconductor capacitor device of this invention will be described below with reference to the accompanying drawings.

With reference to FIGS. 1A–1E, FIGS. 2A–2D, and FIG. 3 in order, the process for producing a pair of MIM capacitors in this embodiment will be explained.

Figure 1A:
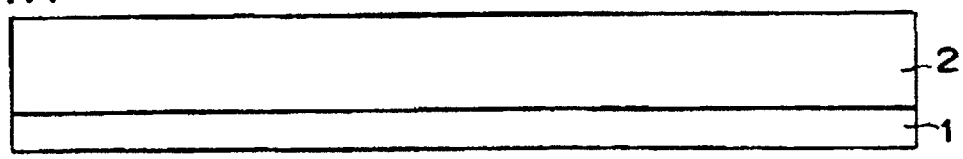
FIGS. 1A, 1B, 1C, 1D, and 1E are views explaining the first half of the process for producing MIM capacitor elements in an embodiment of the semiconductor capacitor device of this invention.
Figure 1B:
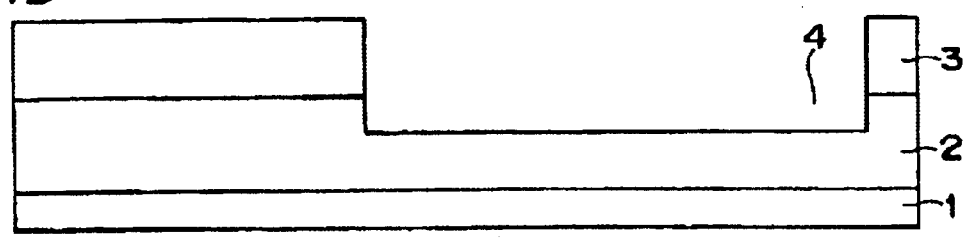

First, as shown in FIG. 1A, after a transistor portion (not shown in the figure) is formed on a semiconductor substrate 1, a first interlayer insulating film 2 is deposited Then, as shown in FIG. 1B, a resist pattern 3 is formed, which is then formed with an opening using a photolithography process. Using this resist pattern 3 as a mask, a surface of the first interlayer insulating film 2 is etched using an anisotropic etching technique and so on to form an approx. 150–300 nm deep groove 4.

Figure 1C:
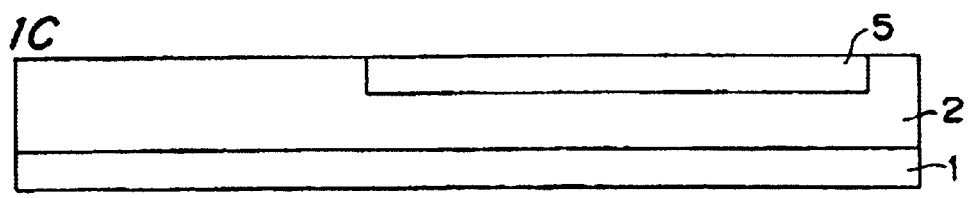

Next, after removing the resist pattern 3, a tungsten film 5 is deposited to a thickness of approx. 500 nm–800 nm on the entire surface of the first interlayer insulating film 2 including the groove 4 using, for example, a CVD (Chemical Vapor Deposition) method. After that, the tungsten film is polished by a CMP (Chemical Mechanical Polish) method until the surface of the first layer insulating film 2 is exposed, as shown in FIG. 1C. In this way, the tungsten film 5 which is buried in the first interlayer insulating film 2 and which is to become a lower electrode of a first MIM capacitor C1 is formed.

Figure 1D:
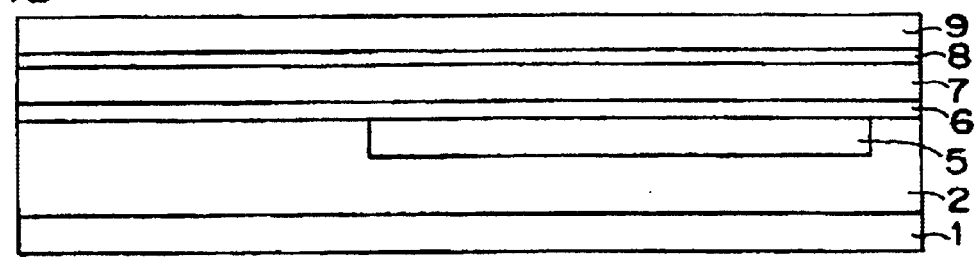

Thereafter, as shown in FIG. 1D, a first capacitor dielectric film 6 is deposited to a film thickness of about 30–80 nm by a plasma CVD method and then a first metal film 7 is deposited to a film thickness of about 400–600 nm by a sputtering method or a CVD method. Further, a second capacitor dielectric film 8, of which the composition is different from that of the first capacitor dielectric film, is deposited to a film thickness of about 40–80 nm by the plasma CVD method and then a second metal film 9 is deposited to a film thickness of about 200–400 nm by the sputtering method or the CVD method. It is preferred that the second capacitor dielectric film 8 is a silicon nitride film, while the first capacitor dielectric film 6 is a silicon oxide film.

Figure 1E:
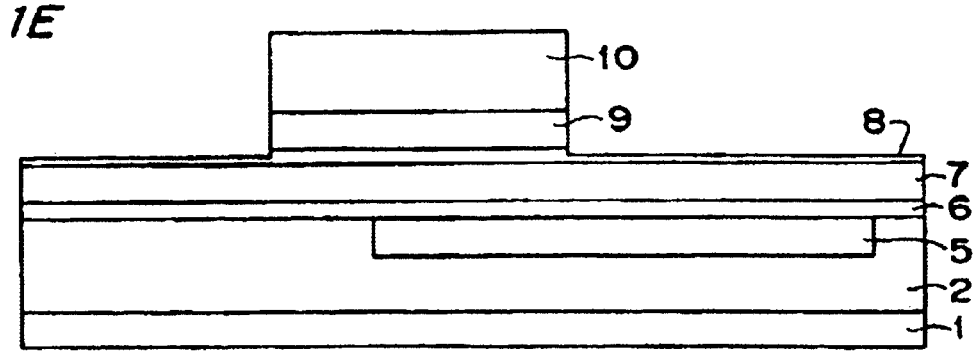

After that, as shown in FIG. 1E, using a resist pattern 10 formed by the photolithography process as a mask, the second metal film 9 is selectively processed using an anisotropic etching technique or any other suitable method to form an upper electrode 9 of a second MIM capacitor C2.

Figure 2A:
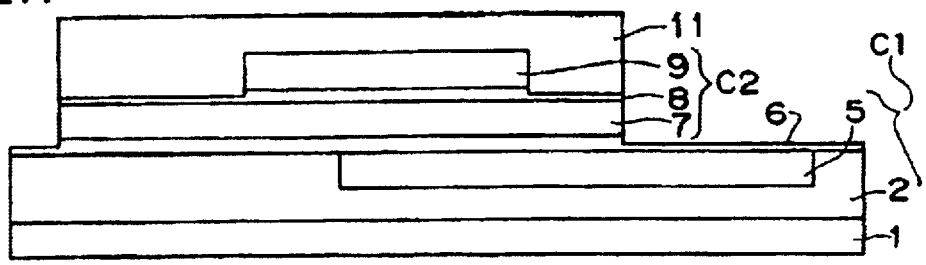
FIGS. 2A, 2B, 2C, and 2D are views explaining the latter half of the process for producing the MIM capacitor elements in the above embodiment.

Next, as shown in FIG. 2A, the second capacitor dielectric film 8 and the first metal film 7 are selectively processed using as a mask a resist pattern 11 formed by the photolithography process to form a lower electrode of the second MIM capacitor C2 to thereby form the second MIM capacitor C2. In this way, the two MIM capacitors C1 and C2 that uses the first metal film 7 as a common electrode are formed.

Figure 2B:
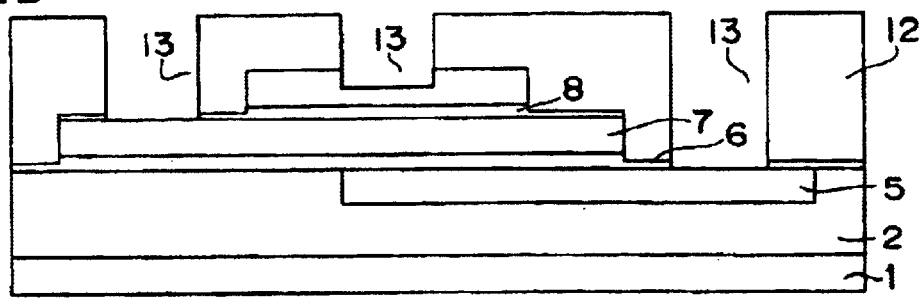

Thereafter, a second interlayer insulating film 12 is deposited to a thickness of about 2000–3000 nm. A surface of this film is planarized by the CMP method. Then, the film is selectively processed using the photolithography and selective etching techniques to form via holes 13 therein as shown in FIG. 2B.

Figure 2C:
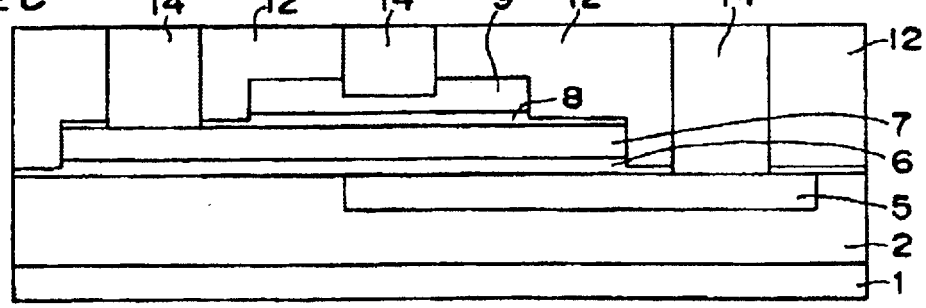

Next, after a titanium nitride film (omitted in the figure) is formed to a thickness of about 30–60 nm on the surfaces of the via holes 13 using the CVD or sputtering method, a thick tungsten film 14 is deposited to a thickness of about 800–1500 nm by the CVD method. Thereby, a state where the via holes 13 are filled with the titanium nitride film and the tungsten film 14 is achieved. Then, surface polishing by the CMP method is performed starting with the surface of the tungsten film 14 to remove the tungsten and titanium nitride films other than the film portions filled in the via holes, whereby a plug 14 (same reference number as that for the tungsten film is used for the sake of convenience) made of the titanium nitride film and the tungsten film 14 is formed in each via hole 13, as shown in FIG. 2C.

Figure 2D:
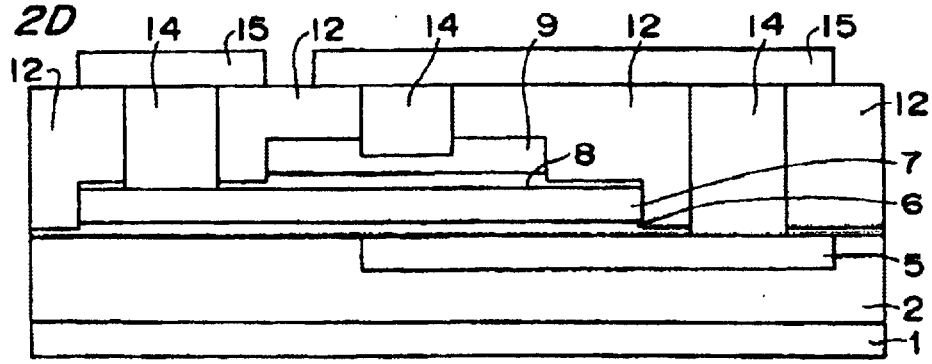

After that, in order to form an interconnection or wiring layer 15 as shown in FIG. 2D, a titanium nitride film, for example, is formed to a thickness of about 30–60 nm, then an aluminum film is formed to a thickness of about 400–600 nm, and then a titanium nitride film is formed to a thickness of about 30–60 nm. Thereafter, these films are selectively removed using the photolithography technique and selective etching thereby forming the interconnection layer 15 that have been patterned.

Figure 3:
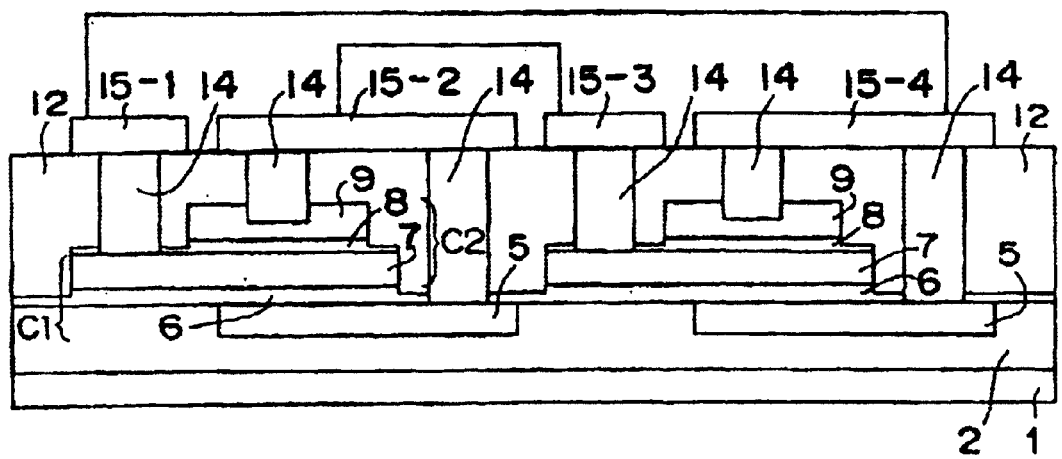
FIG. 3 is a sectional view of the MIM capacitor elements that have been completed.
Figure 4:
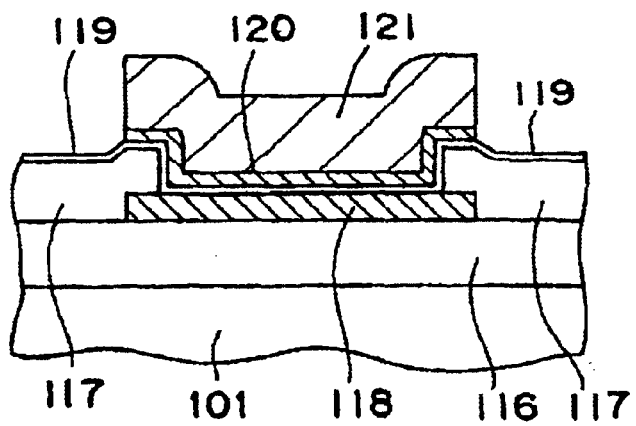
FIG. 4 is a schematic sectional view of an essential part of a conventional semiconductor device.
Figure 5:
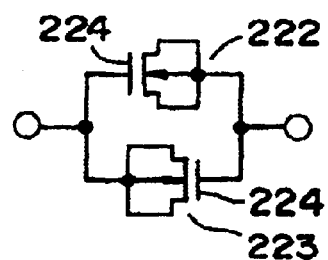
FIG. 5 is an equivalent circuit diagram of a conventional semiconductor device.

By the above production process, the two MIM capacitors C1, C2 having different capacitor dielectric films 6, 8 and the interconnection layer 15 therefor are formed. That is, as shown in FIG. 3, the first MIM capacitor C1 consists of the lower electrode 5, the first capacitor dielectric film 6 and the upper electrode 7, while the second MIM capacitor consists of the lower electrode 7, the second capacitor dielectric film 8 and the upper electrode 9. As is obvious, the upper electrode 7 of the first MIM capacitor C1 and the lower electrode 7 of the second MIM capacitor C2 are provided by the common metal electrode 7.

In the structures shown in the left and right sides of FIG. 3 where two pairs of the first and second MIM capacitors are shown, interconnection layers 15-1 and 15-3 are connected to the upper electrodes 7 of the first MIM capacitors C1 and the lower electrodes 7 of the second MIM capacitors C2 through the plugs 14. Further, interconnection layers 15-2 and 15-4 are connected to the lower electrodes 5 of the first MIM capacitors C1 and the upper electrodes 9 of the second MIM capacitors C2 through the plugs 14.

By this arrangement, two pairs of the first MIM capacitor C1 and the second MIM capacitor C2 that are connected in inverse parallel with each other using the electrode 7 as a common electrode are formed. The first MIM capacitors have the same shape and size, and the second MIM capacitors also have the same shape and size.

Furthermore, the interconnection layers 15-1 and 15-2 are connected to the interconnection layers 15-4 and 15-3, respectively.

Figure 8:
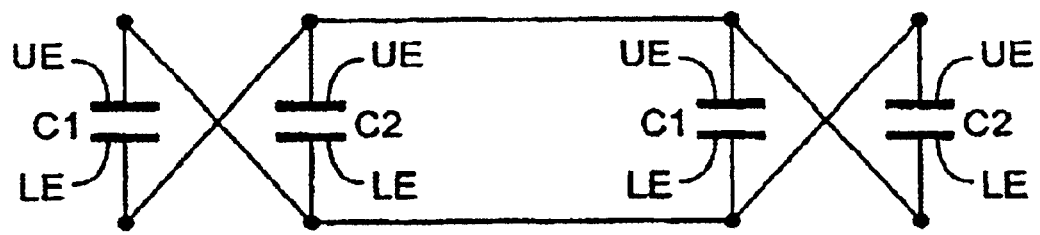
FIG. 8 is an equivalent circuit diagram of the MIM capacitor elements of FIG. 3.

FIG. 8 shows an equivalent circuit diagram of the thus obtained capacitor structure. In FIG. 8, reference symbol UE denotes an upper electrode (corresponding to 7 or 9 in FIG. 3) and reference symbol LE denotes a lower electrode (corresponding to 5 or 7 in FIG. 3). A pair of MIM capacitors C1 and C2 on the left-hand side of FIG. 8 corresponds to the pair of MIM capacitors C1 and C2 on the left-hand side of FIG. 3, with the upper electrode UE of the MIM capacitor C1 and the lower electrode LE of the MIM capacitor C2 being formed of one common layer 7 in the FIG. 3 embodiment. The same is true with the pair of MIM capacitors C1 and C2 on the right-hand side of FIG. 8. As is apparent from FIG. 8, in each capacitor pair, the upper electrode UE and the lower electrode LE of the MIM capacitor C1 are electrically connected to the lower electrode LE and the upper electrode UE of the MIM capacitor C2, respectively. In other words, the paired MIM capacitors C1 and C2 are electrically connected in inverse parallel. In addition, the two first MIM capacitors C1 are electrically connected in inverse parallel (that is, the upper electrode and the lower electrode of one first MIM capacitor C1 are electrically connected to the lower electrode and the upper electrode of the other first MIM capacitor C1). Similarly to the first MIM capacitors C1, the two second MIM capacitors C2 are electrically connected in inverse parallel.

According to the FIG. 3 embodiment, the electrodes 5, 7, 9 of the pair of the MIM capacitors C1, C2 formed on the semiconductor substrate are connected in inverse parallel, i.e., the MIM capacitors C1 and C2 are electrically connected in parallel, with the upper and lower electrodes 9 and 5 connected and the lower and upper electrodes 7, 7 connected. Also, the electrodes 5, 7; 5, 7 of the two MIM capacitors C1 as well as the electrodes 7, 9; 7, 9 of the other two MIM capacitors C2 are connected in inverse parallel fashion. Accordingly, the voltage dependences of the capacitances of both the capacitors are cancelled as much as possible, thereby making it possible to make the voltage dependence of the capacitance of the capacitor device small.

More specifically, as to the voltage dependency of the capacitance, it is known that the capacitance changes in proportion to the square of applied voltage as shown in the following equation:

$$C = C0 \cdot (1 + a \cdot V + b \cdot V^2) \quad (11)$$

where C represents a capacitance value, C0 represents a capacitance value at 0 [V], V represents a voltage applied, and a and b are coefficients of the first- and second-order terms of the equation representing the voltage dependence of the capacitance value, respectively.

If two MIM capacitors having the same characteristic or property are connected in inverse parallel with each other, when a voltage of V is applied to one of the MIM capacitors, a voltage of −V is applied to the other capacitor. Therefore, capacitances, $C_L$ and $C_R$, of the two MIM capacitors are represented by the equations (12) and (13) respectively:

$$C_L = C0 \cdot (1 + a \cdot V + b \cdot V^2) \quad (12)$$

$$C_R = C0 \cdot (1 - a \cdot V + b \cdot V^2) \quad (13)$$

Further, the synthesized or combined capacitance Cc of these capacitors is represented by the formula (14):

$$C_C = C_L + C_R = 2C0 \cdot (1 + b \cdot V^2) \quad (14)$$

It is clear from this formula that connecting the paired first MIM capacitors C1 having the same characteristic in inverse parallel with each other cancels the first-order term of expressions (12) and (13). The same holds true for the paired second MIM capacitors C2. Therefore, the combined capacitances $C1_c$ and $C2_c$ of the paired first MIM capacitors and of the paired second MIM capacitors are expressed as follows:

$$C1_c = 2C0 \cdot (1 + b1 \cdot V^2) \quad (2C0 = C01) \quad (15)$$
$$= C01 \cdot (1 + b1 \cdot V^2)$$

$$C2_c = 2C0 \cdot (1 + b2 \cdot V^2) \quad (2C0 = C02) \quad (16)$$
$$= C02 \cdot (1 + b2 \cdot V^2)$$

Therefore, if different materials that would give the coefficients "b1" and "b2" in expressions (15) and (16) opposite signs ("+" and "−") are used as dielectric materials of the first and second MIM capacitors C1 and C2, the second-order terms in expressions (15) and (16) can be substantially canceled. Here, a coefficient Γ of the voltage dependence of the capacitance is defined by the following equation (17):

$$\Gamma = (C - C0)/V \cdot 10^6 \ [ppm] \quad (17)$$

Figure 6:
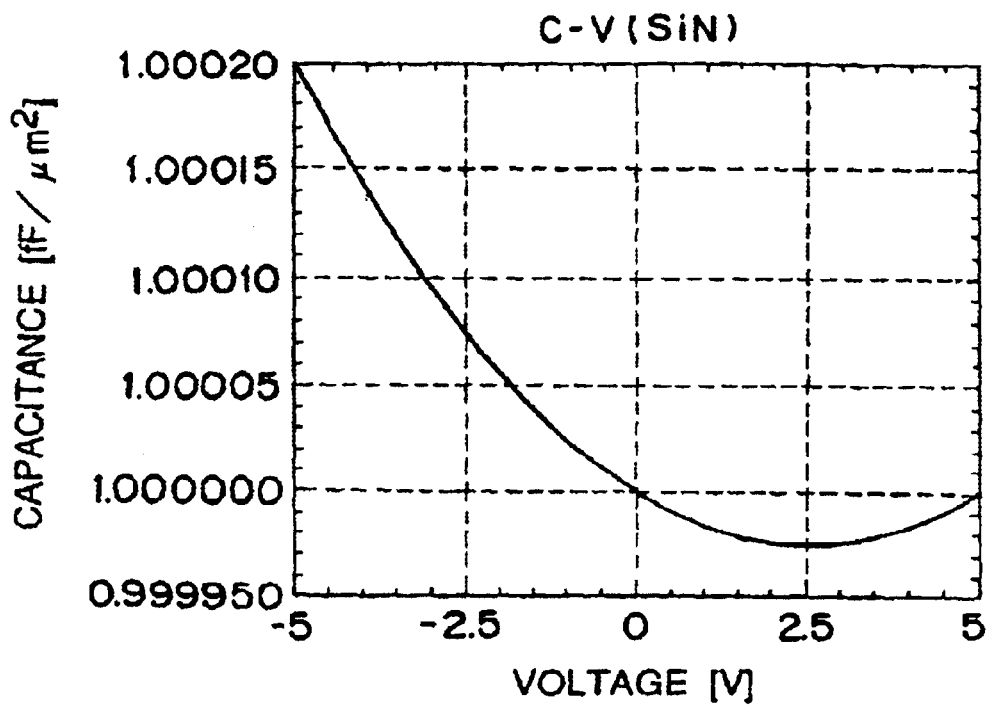
FIG. 6 is a characteristic view showing the voltage dependence of the capacitance of an MIM capacitor using SiN as a capacitor dielectric film.

In the case of the MIM capacitor C2 using a silicon nitride film as the capacitor dielectric film 8, as shown in FIG. 6, a=−20 [ppm/V] and b=4 [ppm/V²]. Thus, if this MIM capacitor is singly used, Γ=−16 [ppm] at 1 [V], but Γ becomes 4 [ppm] if the MIM capacitors are connected in inverse parallel with each other. Accordingly, it is found that the voltage dependence of the capacitance of the capacitor device is reduced by connecting two MIM capacitors in inverse parallel with each other.

Furthermore, a silicon oxide film was used as the first capacitor dielectric film 6 in the first MIM capacitor C1, while a silicon nitride film was used as the second capacitor dielectric film 8 in the second MIM capacitor C2. Therefore, the first and second MIM capacitors have different voltage-dependences of the capacitances. By connecting these first and second MIM capacitors in inverse parallel such that the voltage dependences of the capacitances of the capacitors counteract each other, the coefficient of voltage dependence of the capacitance of the capacitor device can be made substantially 0 [ppm].

Figure 7:
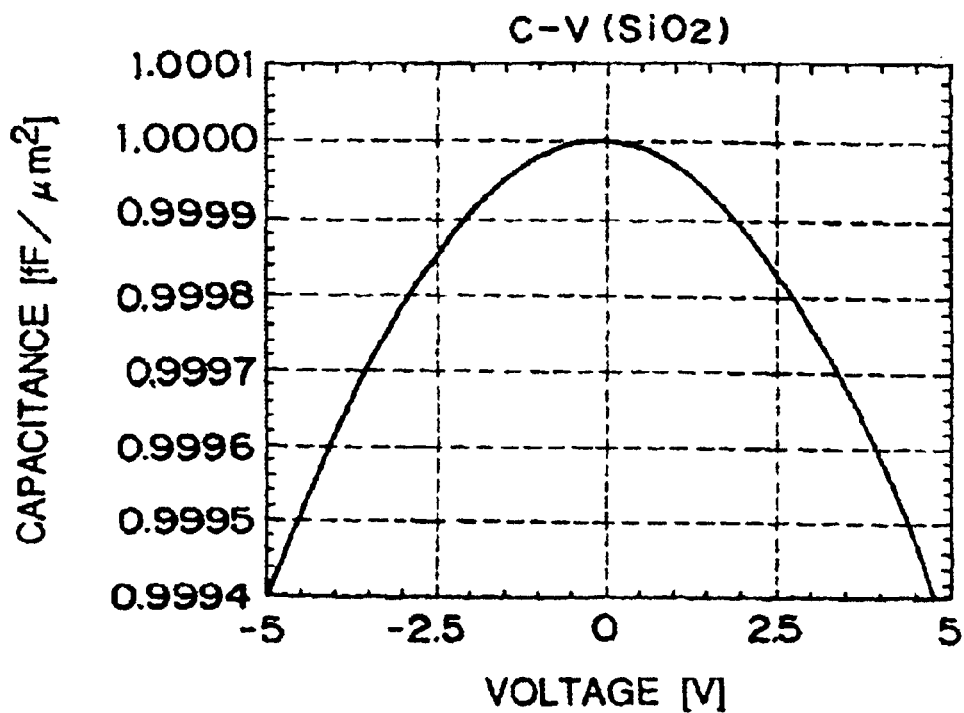
FIG. 7 is a characteristic view showing the voltage dependence of the capacitance of an MIM capacitor using $SiO_2$ as a capacitor dielectric film.

More particularly, when the first capacitor dielectric film 6 is a silicon oxide film having a film thickness of 35 nm and the second capacitor dielectric film 8 is a silicon nitride film having a film thickness of 65 nm, the voltage dependences of the capacitances of the capacitors become as shown in FIGS. 7 and 6 respectively.

This means that, in the above expressions (15) and (16), C01=1 [fF/μm²], b1=−30 [ppm/V²], C02=1 [fF/μm²], and b2=4 [ppm/V²]. If the first and second MIM capacitors have electrode-opposing areas at a ratio of 2:15 so as to satisfy the relationship shown in the equation (18) below, and also connected in parallel with each other, then the combined capacitance C3 of the parallel-connected capacitors is represented by the equation (19) below. In other words, the voltage dependence of the combined capacitance C3 of the four MIM capacitors can be made substantially zero.

$$C01 \cdot b1 + C02 \cdot b2 = 0 \quad (18)$$

$$C3 = C1_c + C2_c = C01 + C02 \quad (19)$$

In this way, the coefficient Γ of voltage dependence of the capacitance can be made substantially 0 [ppm] by inverse-parallel connection of two MIM capacitors C2 and C1 having different voltage-dependent characteristics of the capacitances and having different dielectric compositions such that the voltage dependences of the capacitances are counteracted by each other, although when an MIM capacitor is singly used as in the case where only the second MIM capacitor C2 is used, the coefficient Γ of voltage dependence of the capacitance is −16 [ppm].

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor capacitor device, comprising:

two first MIM capacitors formed on a semiconductor substrate and each having a lower electrode, a first capacitor dielectric film, and an upper electrode, the first MIM capacitors being electrically connected in inverse parallel with each other; and two second MIM capacitors formed on the semiconductor substrate and each having a lower electrode, a second capacitor dielectric film, and an upper electrode, the second MIM capacitors being electrically connected in inverse parallel with each other and associated with respective first MIM capacitors, the first and associated second MIM capacitors are electrically connected in inverse parallel with each other; and the second capacitor dielectric film having a composition different from that of the first capacitor dielectric film.

2. The semiconductor capacitor device according to claim 1, voltage dependences of capacitances of the first and second MIM capacitors are expressed by respective quadratics of voltage, and coefficients of second-order terms of the quadratics have opposite signs.

3. The semiconductor capacitor device according to claim 2, wherein the coefficients of the second-order terms of the quadratics for the first and second MIM capacitors have the same magnitude.

4. The semiconductor capacitor device according to claim 1, wherein the first and second MIM capacitors share a metal layer that serves as the upper electrode of the first MIM capacitor and the lower electrode of the second MIM capacitor.

5. The semiconductor capacitor device according to claim 4, the lower electrode and the first capacitor dielectric film of the first MIM capacitor, the metal layer, and the second capacitor dielectric and the upper electrode of the second MIM capacitor are stacked in this order.

6. The semiconductor capacitor device according to claim 1, wherein one of the first and second capacitor dielectric films is formed of a silicon oxide film and the other of the first and second capacitor dielectric films is formed of a silicon nitride film.

7. The semiconductor capacitor device according to claim 6, wherein the silicon oxide film is of a thickness of 35 nm and the silicon nitride film is of a thickness of 65 nm.

8. The semiconductor capacitor device according to claim 1, the second MIM capacitor and the first MIM capacitor are laid one on the other.

9. The semiconductor capacitor device according to claim 1, wherein the two first MIM capacitors have the same shape and size, and the two second MIM capacitors have the same shape and size.

* * * * *